United States Patent
Hillman et al.

(10) Patent No.: US 11,020,766 B2
(45) Date of Patent: Jun. 1, 2021

(54) SPIN COATING APPARATUS, SYSTEM, AND METHOD

(71) Applicant: Service Support Specialties, Inc., Montville, NJ (US)

(72) Inventors: Gary Hillman, Livingston, NJ (US); Joseph Deghuee, Ridgeland, SC (US)

(73) Assignee: SERVICE SUPPORT SPECIALTIES, INC.

( * ) Notice: Subject to any disclaimer, the term of this patent is extended or adjusted under 35 U.S.C. 154(b) by 0 days.

(21) Appl. No.: 16/576,195

(22) Filed: Sep. 19, 2019

(65) Prior Publication Data
US 2020/0101486 A1    Apr. 2, 2020

Related U.S. Application Data

(60) Provisional application No. 62/738,356, filed on Sep. 28, 2018.

(51) Int. Cl.
*B05D 1/00* (2006.01)
*B05C 11/08* (2006.01)
*B05C 11/06* (2006.01)

(52) U.S. Cl.
CPC .............. *B05C 11/08* (2013.01); *B05C 11/06* (2013.01)

(58) Field of Classification Search
CPC ......... B05C 11/06; B05C 11/08; B05D 1/005; H01L 21/6715
USPC .......................................................... 427/240
See application file for complete search history.

(56) References Cited

U.S. PATENT DOCUMENTS

| 4,822,639 | A |   | 4/1989  | Fujii et al. |
| 5,069,156 | A |   | 12/1991 | Suzuki |
| 5,234,499 | A |   | 8/1993  | Sasaki et al. |
| 5,650,196 | A | * | 7/1997  | Muhlfriedel ............ B05C 9/02  118/500 |
| 5,670,210 | A |   | 9/1997  | Mandal et al. |
| 5,885,661 | A |   | 3/1999  | Batchelder |

(Continued)

FOREIGN PATENT DOCUMENTS

| CN | 107249760 A | * | 10/2017 | ............ B05D 1/005 |
| DE | 102004011504 B4 |   | 8/2015 |

(Continued)

OTHER PUBLICATIONS

Tyona, M.D., "A theoritical study on spin coating technique". Advances in Materials Research, vol. 2, No. 4 (2013) 195-208. DOI: http://dx.doi.org/10.12989/amr.2013.2.4.195.*

(Continued)

*Primary Examiner* — Bret P Chen
(74) *Attorney, Agent, or Firm* — The Belles Group, P.C.

(57) ABSTRACT

A spin coating apparatus, system, and/or method that increase the uniformity of a coating material on a substrate. The spin coating system may be specifically directed for use with polygonal shaped substrates. The spin coating system may include a process chamber within which the substrate is located, spinning on a chuck, during operation. The spin coating system may include gas injection ports that inject a gas into the process chamber so that the gas contacts the substrate along corner portions of its front surface. This injection of the gas increases pressure and prevents excessive build-up of the coating material that may otherwise occur when spin coating polygonal shaped substrates.

16 Claims, 10 Drawing Sheets

(56) References Cited

U.S. PATENT DOCUMENTS

| | | | | |
|---|---|---|---|---|
| 5,965,200 | A * | 10/1999 | Tateyama | G03F 7/3021 |
| | | | | 427/240 |
| 6,004,631 | A * | 12/1999 | Mori | H01J 37/32366 |
| | | | | 427/534 |
| 6,013,315 | A * | 1/2000 | Mandal | B05B 1/044 |
| | | | | 118/320 |
| 6,458,208 | B1 * | 10/2002 | Anai | B01D 19/0005 |
| | | | | 118/52 |
| 6,612,315 | B2 | 9/2003 | Pascal et al. | |
| 6,866,887 | B1 | 3/2005 | Chen et al. | |
| 7,553,374 | B2 | 6/2009 | Hamada et al. | |
| 7,559,155 | B2 | 7/2009 | Hall | |
| 7,615,117 | B2 | 11/2009 | Kobayashi et al. | |
| 7,662,436 | B1 * | 2/2010 | Wei | G03F 7/162 |
| | | | | 427/240 |
| 2001/0028920 | A1 * | 10/2001 | Ito | H01L 21/6708 |
| | | | | 427/240 |
| 2002/0098283 | A1 * | 7/2002 | Gurer | B05C 5/0208 |
| | | | | 427/240 |
| 2006/0023058 | A1 * | 2/2006 | Tanaka | B23K 26/0823 |
| | | | | 347/224 |
| 2006/0223336 | A1 * | 10/2006 | Wei | H01L 21/02282 |
| | | | | 438/782 |
| 2008/0041523 | A1 | 2/2008 | Kamei et al. | |
| 2009/0226615 | A1 * | 9/2009 | Nakazawa | G03F 7/162 |
| | | | | 427/256 |
| 2009/0258563 | A1 * | 10/2009 | Kwak | G01G 17/04 |
| | | | | 445/3 |
| 2014/0246148 | A1 * | 9/2014 | Liu | B32B 7/12 |
| | | | | 156/275.5 |

FOREIGN PATENT DOCUMENTS

| | | | | |
|---|---|---|---|---|
| JP | 2002-246293 | * | 8/2002 | H01L 21/027 |
| KR | 10-2016-0001799 | * | 6/2014 | G02F 1/1362 |

OTHER PUBLICATIONS

Sadegh-cheri, Mohammad, "Design, Fabrication, and Optical Characterization of a Low-Cost and Open-Source Spin Coater". J. Chem. Educ. 2019, 96, 1268-1272.*

Dasi, Gnyaneshwar, et al., "Improved Electron Injection In Spin Coated Alq3 Incorporated ZnO Thin Film In The Device For Solution Processed OLEDs". AIP Conference Proceedings 1942, 060015 (2018) pp. 1-4; https://doi.org/10.1063/1.5028785.*

Emslie, Alfred G., et al., "Flow of a Viscous Liquid on a Rotating Disk". Journal of Applied Physics 29, 858 (1958) 1 page. Abstract Only https://doi.org/10.1063/1.1723300.* www.MicroChemicals.com, Basics of Microstructuring, Spin Coating, MicroChemicals GmbH, Ulm, Germany www.microchemicals.com/downloads/application_notes.html; pp. 1-10.

* cited by examiner

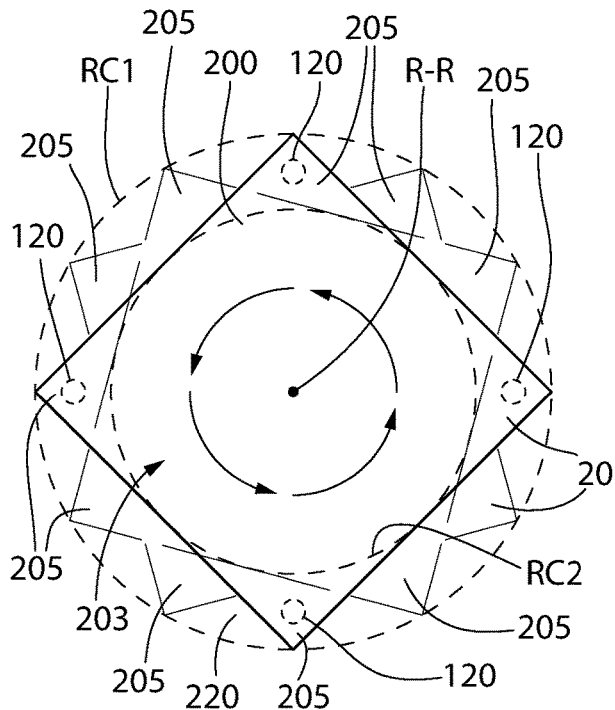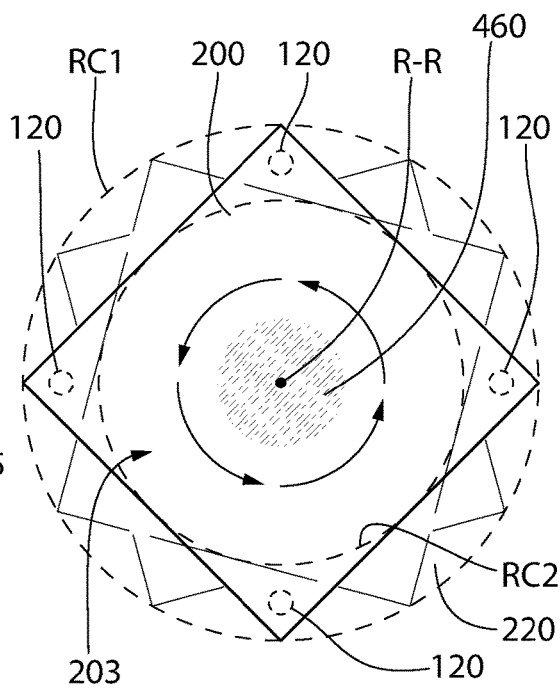
FIG. 7A    FIG. 7B
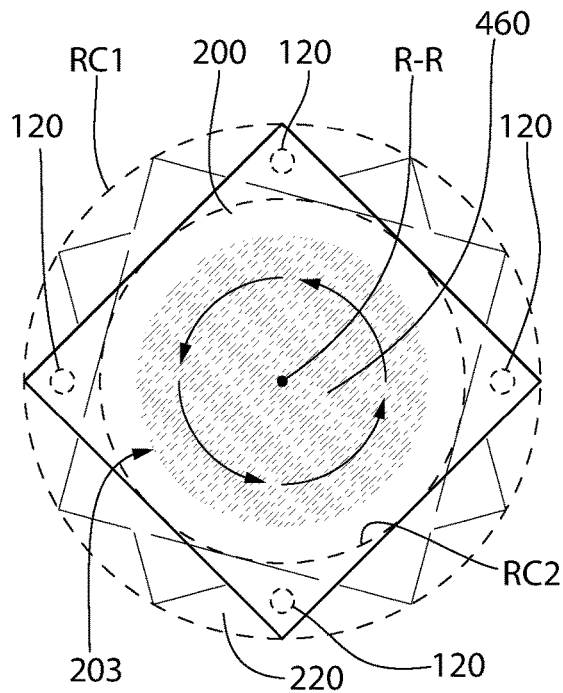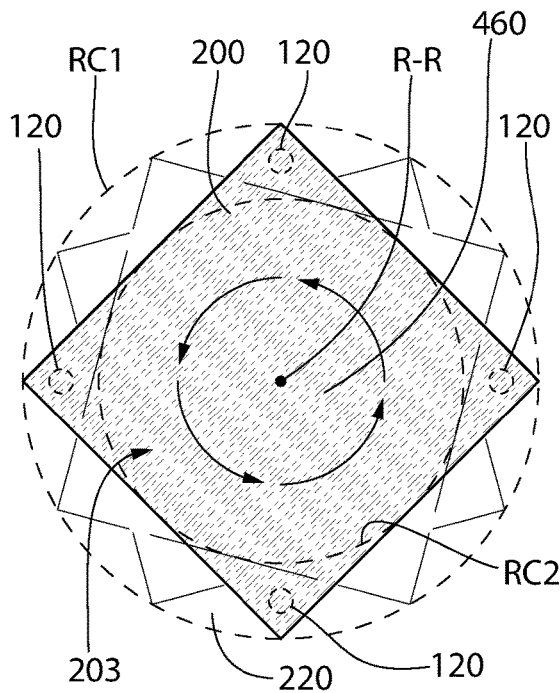
FIG. 7C    FIG. 7D

SPIN COATING APPARATUS, SYSTEM, AND METHOD

CROSS-REFERENCE TO RELATED APPLICATIONS

The present application claims priority to U.S. Provisional Patent Application Ser. No. 62/738,356, filed Sep. 28, 2018, the entirety of which is incorporated herein by reference.

BACKGROUND OF THE INVENTION

In the semiconductor industry, the process of forming "wires" requires precise patterning operations due to the small size of the substrate. The state of the art in forming these small wires involves what is known as spin coating, which lends itself to the creation of a relatively thin, uniform, accurate, and precise film coating of a polymer photoresist on the surface of the substrate. Spin coating is typically done on circular substrates which may be coated uniformly and economically by rotating the circular substrate at a relatively high speed after depositing a bolus of the photoresist on the round substrate. When the spinning process is used with polygonal shaped substrates, the film thickness at the corners of the substrate is substantially different than the film thickness along a circular region of the substrate that is interior to the corners.

The reason for the thicker film at the corners is that as the corners are traveling through the air/gas environment, they are at a higher speed than the regions at the edges within the circular region of the substrate that is interior to the corners. This higher velocity results, owing to Bernoulli's principle, in a pressure drop at the corners and likely substantial turbulence. The combination of turbulence and lower pressure has the effect of "sucking up" the polymer film at the corners, hence the marked thicker films at the corners. This effect has been noted for some time and there have been developed a series of counter measures, some of which are effective to a limited extent, but none of which has resulted in the sort of uniformity that is achievable on circular substrates.

Thus, a need exists for an apparatus, system, and/or method for spin coating polygonal substrates that achieves uniformity in the thickness of the photoresist along the surface of the substrate.

SUMMARY OF THE INVENTION

A spin coating apparatus, system, and/or method that increase the uniformity of a coating material on a substrate. The spin coating system may be specifically directed for use with polygonal shaped substrates. The spin coating system may include a process chamber within which the substrate is located, spinning on a chuck, during operation. The spin coating system may include gas injection ports that inject a gas into the process chamber so that the gas contacts the substrate along corner portions of its front surface. This injection of the gas increases pressure and prevents excessive build-up of the coating material that may otherwise occur when spin coating polygonal shaped substrates.

In one aspect, the invention may be a method of spin coating a substrate having a polygonal shape, the method comprising: dispensing a coating material onto a front surface of the substrate; rotating the substrate about a rotational axis to form a film of the coating material that substantially covers the front surface of the substrate; and injecting a gas onto corner portions of the front surface of the substrate while the substrate is rotating about the rotational axis.

In another aspect, the invention may be a method of spin coating a substrate comprising: dispensing a coating material on a front surface of the substrate, the substrate having a polygonal shape comprising a plurality of vertices and a plurality of sides; rotating the substrate about a rotational axis, wherein upon a 360° rotation of the substrate a path of each of the plurality of vertices of the substrate defines an outer reference circle and a path of a midpoint of each of the plurality of sides of the substrate defines an inner reference circle, a reference ring being defined between the inner and outer reference circles; and injecting a gas onto corner portions of the front surface of the substrate that are located along the reference ring as the substrate rotates about the rotational axis.

In yet another aspect, the invention may be a spin coating system for depositing a coating material onto a front surface of a substrate having a polygonal shape, the spin coating system comprising: a housing defining a process chamber; a chuck located within the process chamber and operably coupled to a motor for rotating the chuck about a rotational axis, wherein the chuck is configured to support and rotate a substrate within the process chamber during a spin coating process; at least one gas injection port forming a passageway into the process chamber; a gas source comprising a gas; and wherein the gas is injected onto corner portions of a front surface of the substrate as the substrate rotates during the spin coating process.

In a further another aspect, the invention may be a spin coating system for depositing a coating material onto a front surface of a substrate having a polygonal shape, the spin coating system comprising: a housing defining a process chamber having an open top end, the housing having a top surface and a polygonal-shaped opening in the top surface that forms the open top end of the process chamber, the polygonal-shaped opening having a plurality of sides and a plurality of vertices; a chuck located within the process chamber and operably coupled to a motor for rotating the chuck about a rotational axis, wherein the chuck is configured to support and rotate a substrate within the process chamber during a spin coating process; a plurality of gas injection ports formed into the top surface of the housing, each of the gas injection ports forming a passageway into the process chamber, wherein each of the gas injection ports is aligned with a different one of the sides of the polygonal-shaped opening; a gas source comprising a gas; and a plurality of conduits, each of the plurality of conduits operably coupled to the gas source and to one of the plurality of gas injection ports to inject the gas onto corner portions of a front surface of a substrate located in the process chamber during the spin coating process.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 7A-7D schematically illustrate the process of spin coating the substrate while injecting gas onto the corners of the front surface of the substrate.

DETAILED DESCRIPTION OF THE INVENTION

Figure 1:
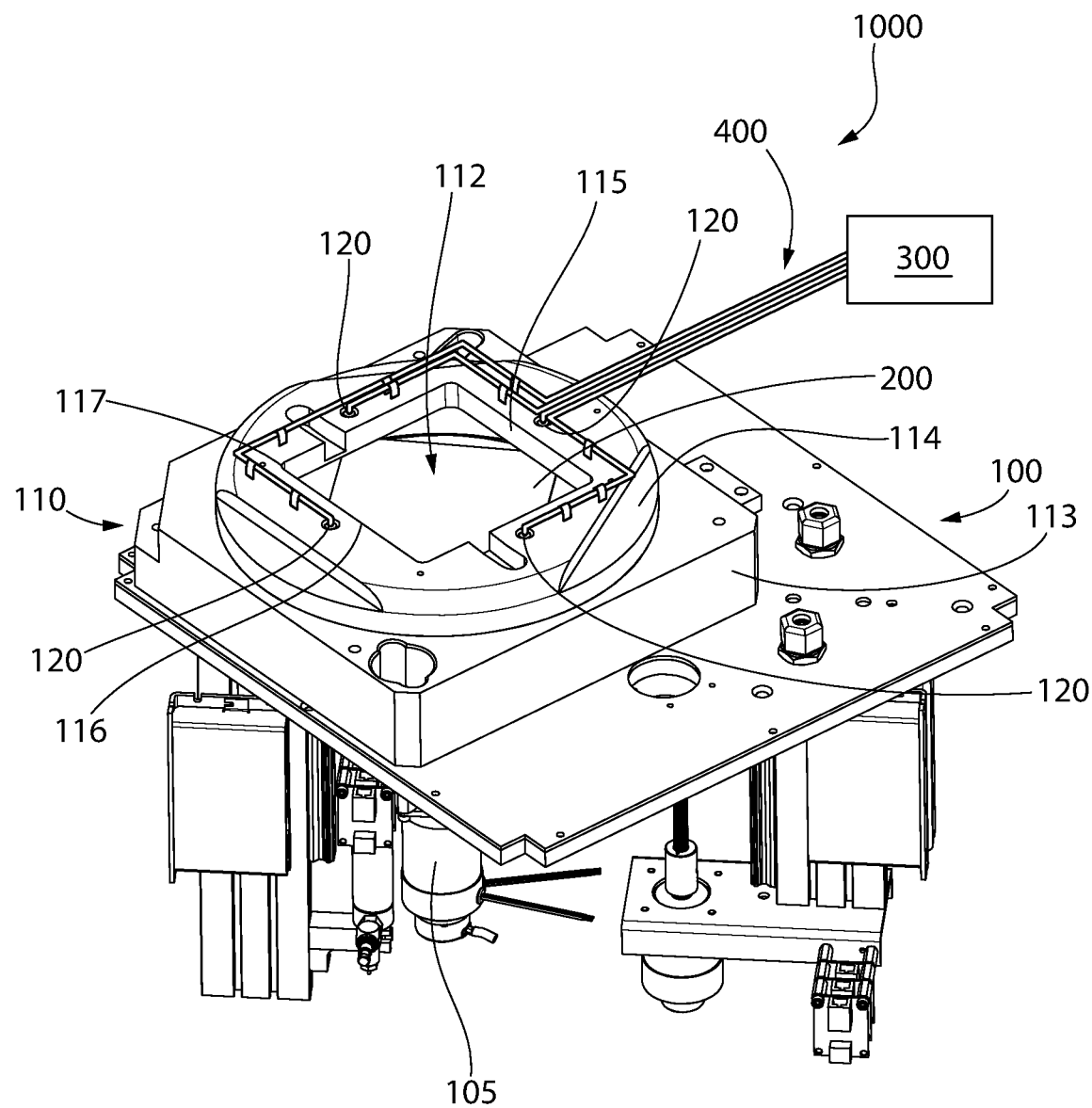
FIG. 1 is perspective view of a spin coating system in accordance with an embodiment of the present invention.

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

Figure 2:
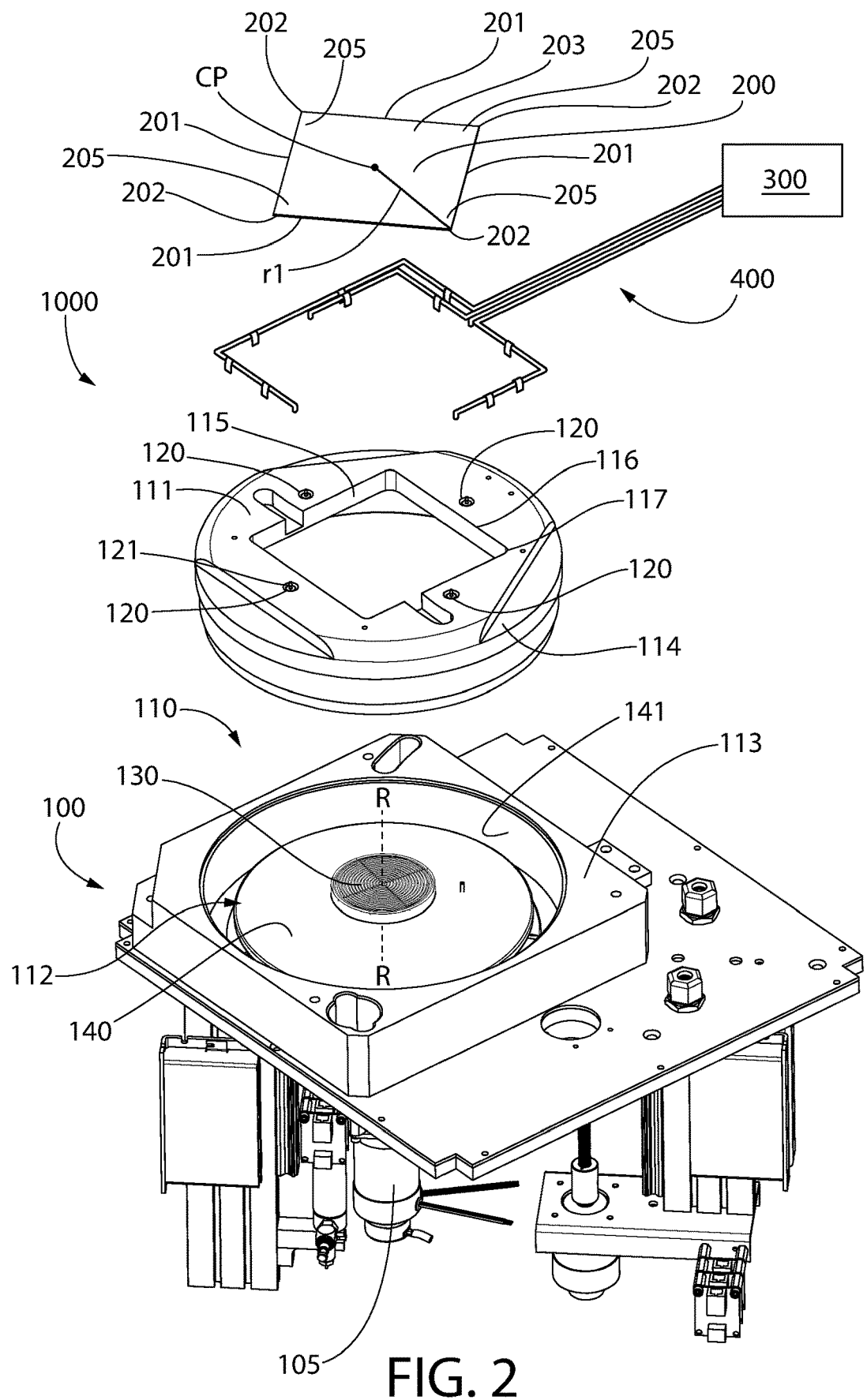
FIG. 2 is an exploded view of the spin coating system of FIG. 1.

Referring to FIGS. 1 and 2 concurrently, a spin coating system 1000 will be described in accordance with an embodiment of the present invention. The spin coating system 1000 is configured to spin or rotate a substrate within a process chamber while a coating material (e.g., polymers, photoresist, etc.) is placed onto a front surface of the substrate so that the coating material spreads into a film that covers the front surface of the substrate. The film may substantially cover the front surface of the substrate in some embodiments and it may entirely cover the front surface of the substrate in other embodiments. Substantial coverage is at least 90% coverage.

For purposes of this invention, it is to be understood that the term substrate is intended to mean any solid substance onto which a layer of another substance is applied and that is used in the solar or semiconductor industries. This includes, without limitation, silicon wafers, glass substrates, fiber optic substrates, fused quartz, fused silica, epitaxial silicon, raw wafers, solar cells, medical devices, disks and heads, flat panel displays, microelectronic masks, and other applications that may require undergoing the processes described herein. The terms substrate and wafer may be used interchangeably throughout the description herein. Furthermore, it should be understood that the invention is not limited to any particular type of substrate and the methods described herein may be used for the processing of any flat article.

In the exemplified embodiment, the spin coating system 1000 is particularly designed for use with substrates that are non-circular. Specifically, the spin coating system 1000 described herein may be particularly designed for use with polygonal shaped substrates. In one particular embodiment, the polygonal shaped substrates are square or rectangular. Stated another way, the substrates may have a quadrangle shape in some embodiments. In some embodiments, the spin coating system 100 described herein may be used with substrates having a regular polygon shape whether that is square, rectangular, hexagonal, octagonal, or some other polygonal shape. For purposes of consistency, features or components that are square or rectangular will be described herein as being quadrangle because that term includes both squares and rectangles. The above notwithstanding, it may still be possible to use a circular substrate with the spin coating system 1000 described herein without any negative effects, but when a polygonal or quadrangular substrate is used in the spin coating system 1000 the uniformity of the coating material thickness is improved relative to conventional technologies.

The spin coating system 1000 generally comprises a spin coating apparatus 100, a substrate 200, a source of gas 300, and a plurality of conduits 400 that couple the source of gas 300 to the spin coating apparatus 100. The spin coating apparatus 100 and its interaction with the conduits 400 and the source of gas 300 will be described herein below.

As noted herein, in the exemplified embodiment the substrate 200 is polygonal shaped rather than circular shaped. Thus, the substrate 200 comprises a plurality of sides 202 and a plurality of vertices 202 at the intersection of adjacent sides 202. Furthermore, the substrate 200 comprises a front surface 203 and a rear surface 204 (see, for example, FIG. 3B) opposite the front surface 203. The front surface 203 of the substrate 200 comprises a plurality of corner portions 205 such that each of the corner portions 205 is adjacent to one of the vertices 202. Specifically, the corner portions 205 of the front surface 203 of the substrate 200 are portions of the substrate 200 that are located a particular distance from the vertices 202. For example, if the substrate 200 has a radius r1 (distance from center-point CP to one of the vertices 202), the corner portions 205 are those areas of the front surface 203 of the substrate 200 that are located no more than ⅓*r1 from one of the vertices, or no more than ¼r1 from one of the vertices 202. This will be described in greater detail below with reference to FIG. 6**.

The spin coating apparatus 100 comprises a housing 110 having a top surface 111. The housing 110 defines a process chamber 112, which is where the substrate 200 is positioned during a spin coating operation. In the exemplified embodiment, the housing 110 comprises a lower housing part 113 and an upper housing part 114 that are detachably coupled together. This detachable coupling may be achieved with screw threads, interference fit, tight fit, external hardware such as screws, set screws, clamps, or the like, or any other manner of coupling. Of course, the invention is not to be so limited in all embodiments and in other embodiments the housing 110 may be a one-piece unitary structure.

The housing 110 comprises a floor 140 and a sidewall 141 extending upwardly from the floor 140 so that the floor 140 and the sidewall 141 collectively define at least a portion of the process chamber 112. In the exemplified embodiment, the housing 110 comprises an opening 115 in the top surface 111 that forms a passageway from the exterior environment into the process chamber 112. The opening 115 forms an open top end of the process chamber 112. As a result, the process chamber 112 is not a sealed or closed chamber, but rather is a chamber that is open to the ambient environment via the opening 115 in the top surface 111 of the housing 110.

Thus, in the exemplified embodiment, the substrate 200 can be loaded into and unloaded from the process chamber 112 through the opening 115 in the top surface 111 of the housing 110. Of course, in other embodiments the opening 115 may be omitted and the housing 110 may instead have a slot along its sidewall for loading and unloading of substrates from the process chamber 112. In still other embodiments, the upper housing portion 114 may be detachable from the lower housing portion 113 to facilitate loading and unloading operations. The spin coating apparatus 100 may also include a splash guard or other cover-like component that covers the top of the housing 110 while still leaving at least a portion of the opening 115 exposed.

In the exemplified embodiment, the opening 115 is quadrangular, or more specifically square, which facilitates loading and unloading of square shaped substrates. It may be preferable in some embodiments for the shape of the opening 115 to correspond with the shape of the substrates 200 being used in the spin coating apparatus 100. Thus, the shape of the opening 115 may be changed depending on the shape of the substrates 200 being used with the spin coating apparatus 100. In some embodiments, the substrates 200 and the opening 115 are polygonal shaped, or quadrangular shaped, or rectangular shaped, or square shaped, although other polygonal shapes may be used as well. As described herein, the spin coating apparatus 100 is particularly designed for use with quadrangular shaped substrates, and thus the opening 115 may be quadrangular in certain preferable embodiments. In some embodiments, a width of the opening 115 measured between opposing sides thereof should be less than a diagonal of the substrate 200 (measured from one vertex to another non-adjacent vertex). This ensures that as the substrate 200 rotates within the process chamber 112, the corner portions 205 of the front surface of the substrate 200 will extend beyond the bounds of the opening 115. The purpose of this, as will be better understood from the description below, is to ensure that a gas being introduced into the process chamber 112 can directly contact the corner portions 205 of the front surface 203 of the substrate 200.

In the exemplified embodiment, the opening 115 is defined by a plurality of sides 116 and a plurality of vertices 117 (only some of which are labeled to avoid clutter). Each side 116 extends between two of the vertices 117. In the exemplified embodiment, the opening 115 has four sides 116 and four vertices 117 because it is a quadrangle. Of course, the number of sides and corners may be changed depending on the shape of the opening 115.

The housing 110 also comprises a plurality of gas injection ports 120 that are formed into the top surface 111 of the housing 110 in the exemplified embodiment. Each of the plurality of gas injection ports 120 extends from the top surface 111 of the housing 110 into the process chamber 112, thereby forming a passageway into the process chamber 112. The gas injection ports 120 may be fitted with nozzles 121 that are located within the gas injection ports 120 to facilitate the introduction of a gas into the process chamber 112 during a spin coating operation.

In the exemplified embodiment, one of the gas injection ports 120 is aligned along each of the sides 116 of the opening 115. Specifically, in the exemplified embodiment each of the gas injection ports 120 is aligned with one of the sides 116 of the opening 115 in a location that is equidistant from the two vertices 117 that the particular side 116 extends between. Stated another way, each of the gas injection ports 120 is aligned with a midpoint of one of the sides 116 of the opening 115. Thus, in the exemplified embodiment there are four of the gas injection ports 120, one aligned with each of the sides 116 of the opening 115 at its midpoint. Of course, additional gas injection ports 120 could be used in other embodiments. In some embodiments, the gas injection ports 120 may form a continuous opening that surrounds the opening 115 through which gas can be introduced into the process chamber 112. Thus, there could be a single gas port that is a continuous opening that surrounds the opening 115. In other embodiments, each of the discrete gas injection ports 120 may have an arcuate shape that corresponds with the path of movement of the corner portions 205 of the front surface 203 of the substrate 200 as the substrate rotates within the process chamber 112.

As will be described in greater detail below, the gas injection ports 120 are intended to introduce a gas into the process chamber 112 at a location such that the gas will contact the corner portions of the substrate 200 as the substrate 200 is rotating within the process chamber 112. This is achieved by positioning the gas injection ports 120 as depicted in the drawings and described herein. However, other locations for the gas injection ports 120 may be possible while still achieving the goal of ensuring that the gas introduced into the process chamber 112 from the gas injection ports 120 contacts the corners of the substrate 200 as the substrate 200 rotates within the process chamber 112.

The spin coating apparatus 100 also comprises a chuck 130 located within the process chamber 112. The chuck 130 is operably coupled to a motor 105 and the motor 105 is operably coupled to a power source (such as a wall outlet via the wires as shown). When the motor 105 is activated, the motor 105 causes the chuck 130 to spin/rotate about a rotational axis R-R. During operation, the substrate 200 is located on the chuck 130, and the chuck 130 may retain the substrate 200 thereon using vacuum suction or any other techniques known in the art. Thus, as the chuck rotates 130, so too does the substrate 200. As described herein, rotation of the substrate 200 is used to flow the coating material from the center of the substrate 200 to the outer edges of the substrate 200 so that the entirety of the substrate 200 becomes covered with a film of the coating material during the spin coating process.

The spin coating system 1000 further comprises a source of gas 300 and a plurality of conduits 400 operably coupling the source of gas 300 to the spin coating apparatus 100. In the exemplified embodiment, the source of gas 300 may be a source of nitrogen gas. However, the invention is not to be so limited in all embodiments and the gas need not be nitrogen in all embodiments. In other embodiments, the gas could be any non-reactive gas. In some embodiments, the gas could be an inert gas.

As noted, each of the conduits 400 extends from the source of gas 300 to the spin coating apparatus 100. Specifically, the conduits 400 may have a first end that is operably coupled to the source of gas 300 and a second end that is operably coupled to one of the gas injection ports 120. Thus, each of the conduits 400 is configured to carry the gas from the source of gas 300 to the gas injection ports 120 where the gas is then introduced or injected into the process chamber 112. The spin coating system 1000 may include valves located along each of the conduits 400 or between the source of gas 300 and the conduits 400 to control the flow of the gas through the conduits 400 to the process chamber 112. Thus, the valves can be opened to permit gas to flow through the conduits 400 to the process chamber 112 or closed to prevent the flow of gas. The valves may also allow for modification of the flow rate. In other embodiments, the spin coating system 1000 may include a pump or the like to pump the gas from the source of gas 300 to the process chamber 112 via the conduits 400. Other techniques for flowing the gas from the source of gas 300 to the process chamber 112 may be used as would be appreciated by persons skilled in the art. In some embodiments, the gas may flow through a solvent prior to being introduced into the process chamber 112.

In some embodiments, the system 1000 may comprise a controller or control system for controlling operation of any valves and/or pumps as well as the motor 105 during operation. The controller would have a memory with process sequences stored therein so that the controller can control opening/closing of valves, activation/deactivation of pumps, activation/deactivation of the motor 105 and operation of any dispensing mechanisms that are included to dispense the coating material or photoresist onto the substrate.

The conduits 400 may be tubes formed of any desired material, including hard and flexible plastic, metal, and the like. Regardless of their particular material of construction, the conduits 400 should be formed of a material that is non-reactive with the gas that is carried in the conduits 400 and it should form a pathway from the source of gas 300 to at least one of the gas injection ports 120. The conduits 400 may be coupled to the housing 110 using clamps or other hardware in some embodiments as shown in the drawings.

Referring to FIGS. 3A-5B, the process of loading the substrate 200 into the process chamber 112 and performing a spin coating operation using the spin coating system 1000 will be described. In these figures, the "A" figure illustrates a perspective view of the spin coating system 1000 and the "B" figure illustrates a cross-sectional view of the spin coating system 1000. The "A" and "B" preceded by the same figure number are illustrating the same step in the process, just in a different view.

Figure 3A:
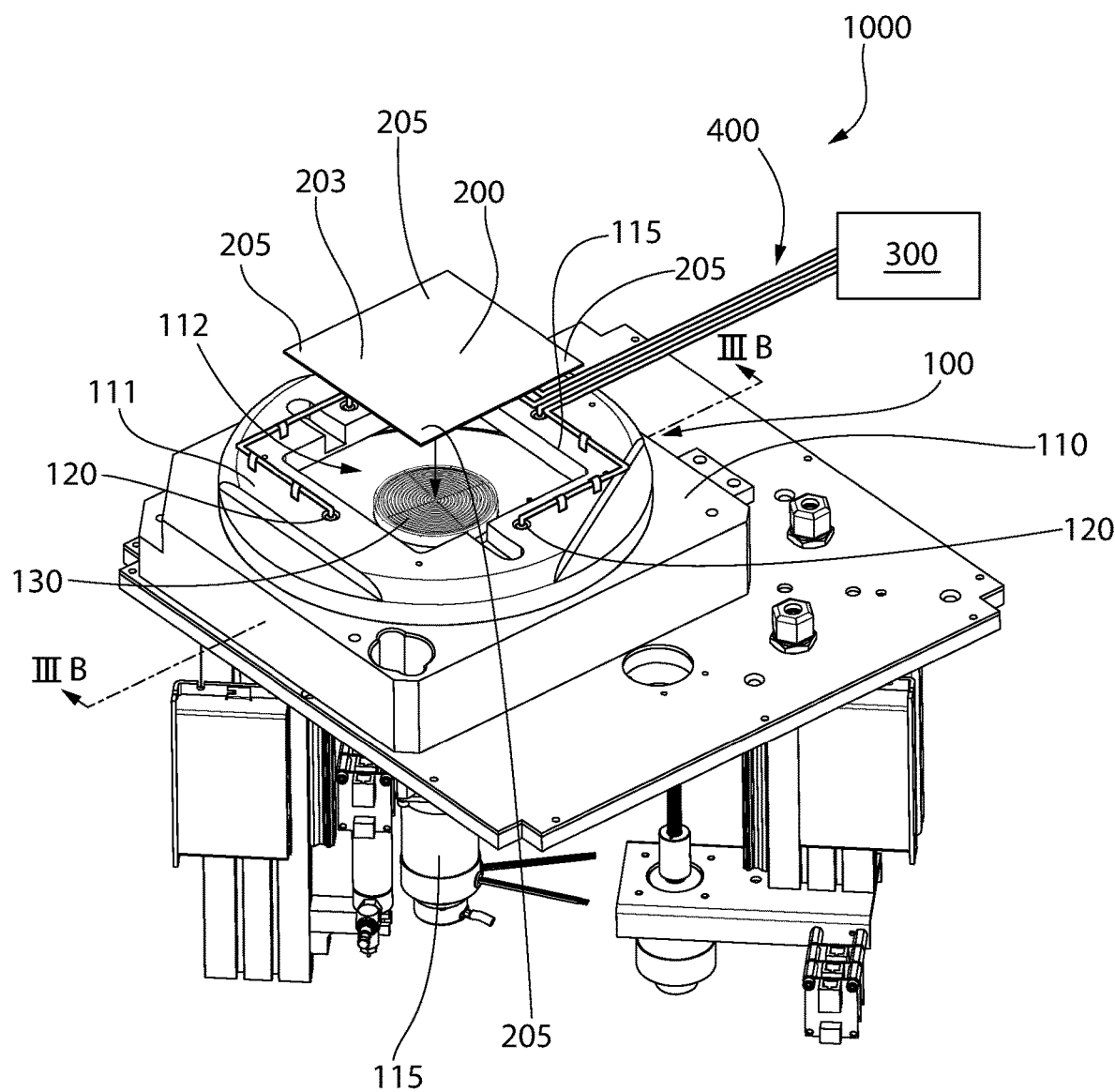
FIG. 3A is a perspective view of the spin coating system of FIG. 1 illustrating a substrate being inserted into a process chamber thereof.
Figure 3B:
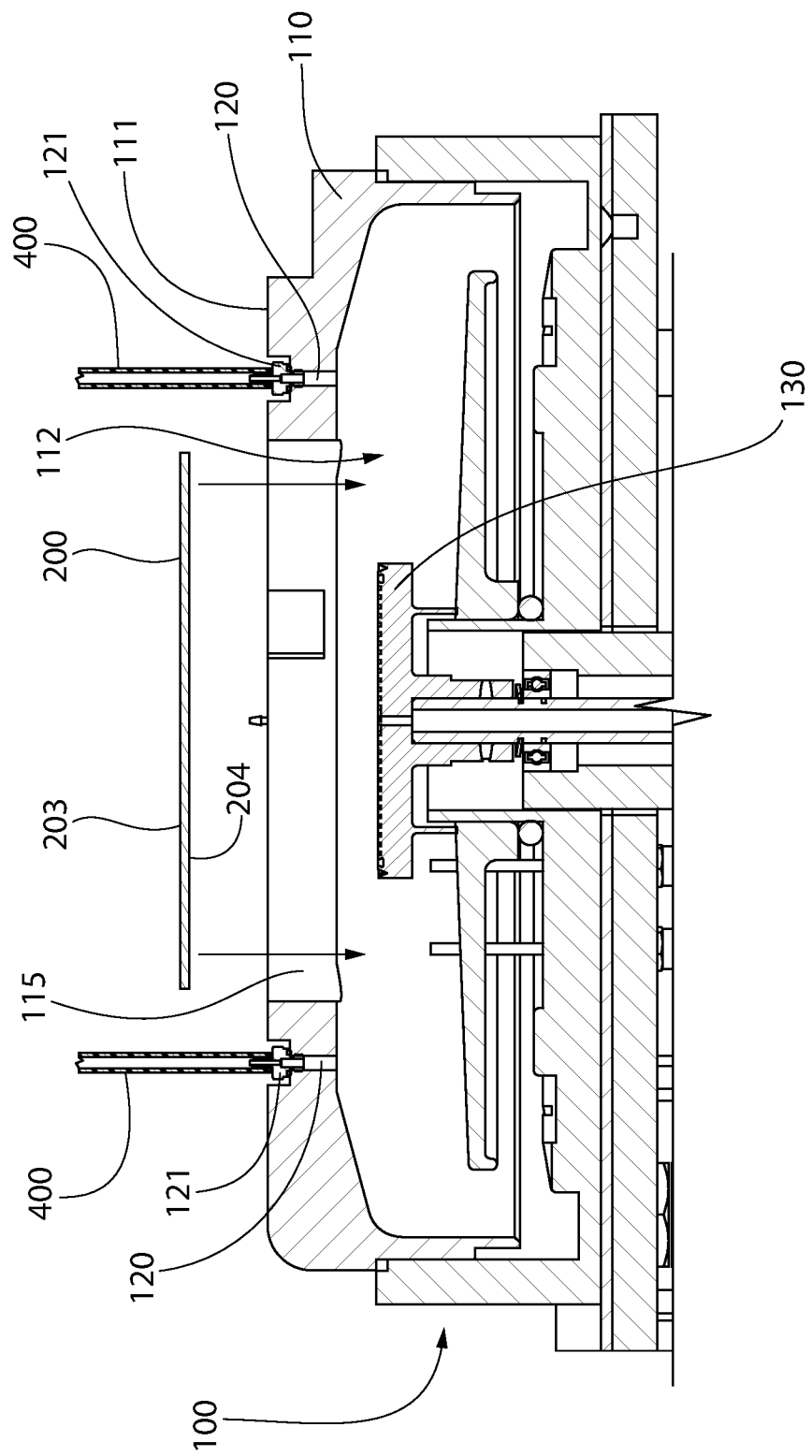
FIG. 3B is a cross-sectional view taken along line IIIB-IIIB of FIG. 3A.

Referring first to FIGS. 3A and 3B, the spin coating system 1000 is illustrated with the substrate 200 positioned just outside of the process chamber 112. In these figures, the substrate 200 is aligned with the opening 115 in the top surface 111 of the housing 110 in preparation for inserting the substrate 200 into the process chamber 112. This step may be performed automatically by a robotic device and controller, although it may also be performed manually by a machine operator. As noted previously, the substrate 200 is quadrangular in shape in the exemplified embodiment, although it could have other polygonal shapes in other embodiments. The opening 115 in the top surface 111 is also quadrangular in shape, having dimensions that are greater than the outer dimensions of the substrate 200 to enable the substrate 200 to pass entirely through the opening 115.

As can be appreciated, in the exemplified embodiment with the quadrangular shaped opening 115 and the quadrangular shaped substrate 200, as the substrate 200 rotates within the process chamber 112 the corners portions 205 of the front surface 203 of the substrate 200 will periodically become aligned with the gas injection ports 120 rather than with the opening 115 so that the gas can be injected directly onto the corner portions 205 of the front surface 203 of the substrate 200. This will be described in more detail below.

Figure 4A:
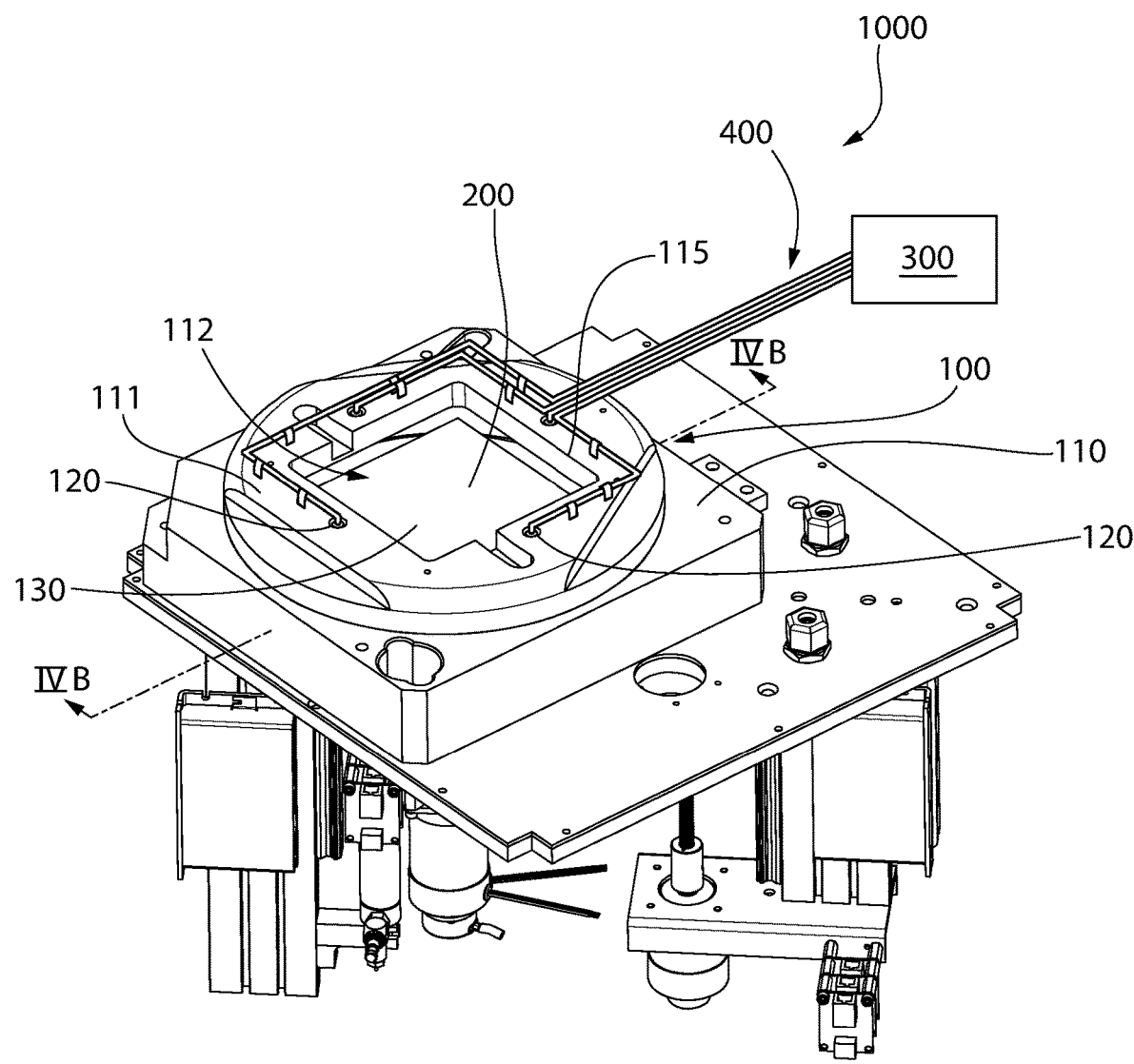
FIG. 4A is a perspective view of the spin coating system of FIG. 1 illustrating a substrate supported by a chuck within the process chamber.
Figure 4B:
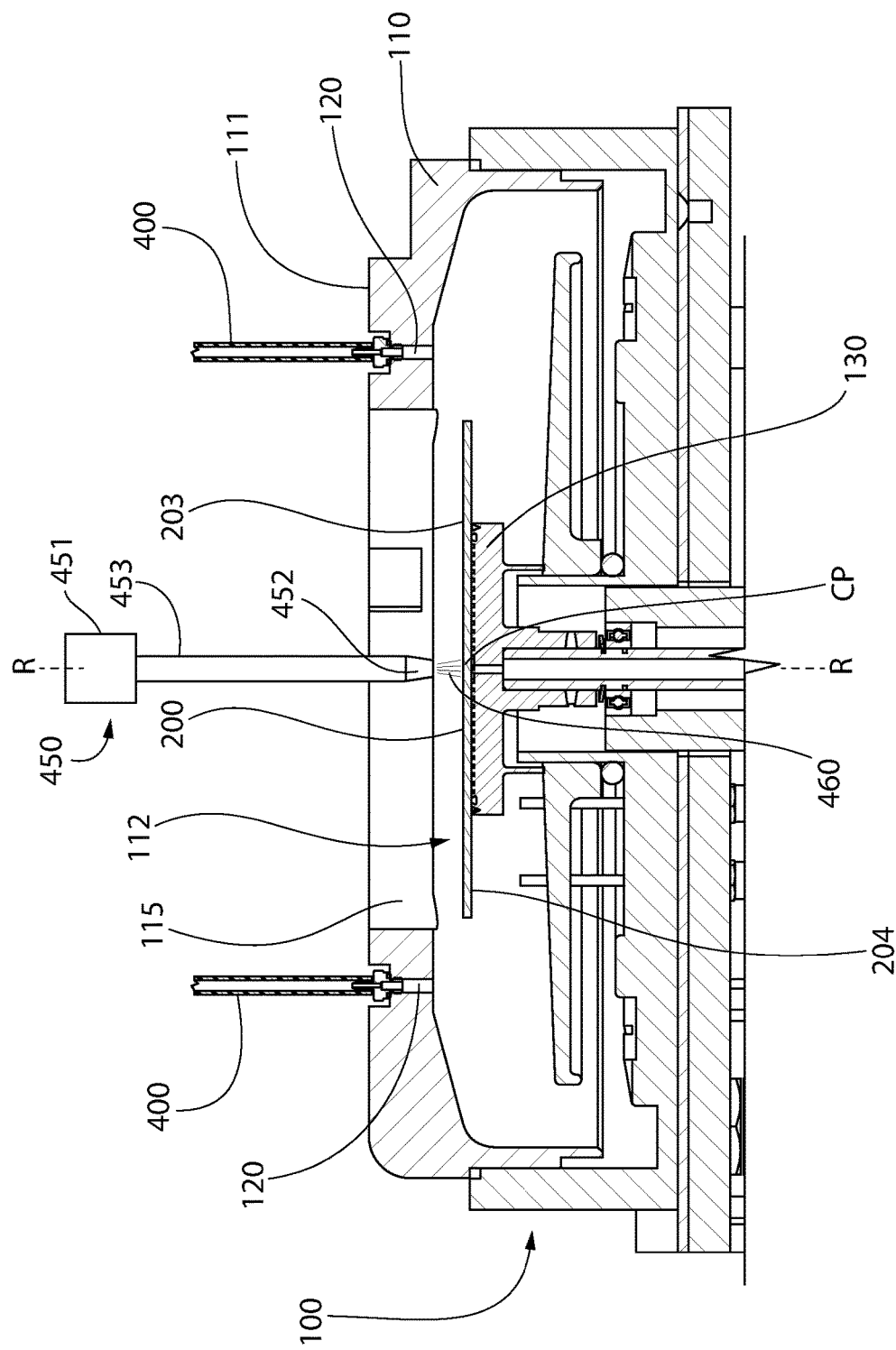
FIG. 4B is a cross-sectional view taken along line IVB-IVB of FIG. 4A.

Next, referring to FIGS. 4A and 4B, the spin coating system 1000 is illustrated with the substrate 200 loaded in the process chamber 112 and positioned atop the chuck 130. Thus, at this point in time the substrate 200 has been inserted into the process chamber 112 through the opening 115 in the top surface 111 of the housing 110 until the substrate 200 comes to rest atop the chuck 130. During the loading procedure, the chuck 130 is not rotating but is static. At this point in time, the process may follow one of two courses. First, in some embodiments, an amount of a coating material may be dispensed onto the front surface 203 of the substrate 200 and then the chuck 130 and the substrate 200 may be rotated about the rotational axis R-R. Second, in other embodiments, the chuck 130 and the substrate 200 may first be rotated and then an amount of a coating material may be dispensed onto the front surface 203 of the substrate 200. Either sequence will achieve the same or similar results.

In some embodiments, the spin coating system 1000 may include a dispensing system 450 (illustrated schematically in FIG. 4B only) for dispensing a coating material 460 onto the front surface 203 of the substrate 200. The dispensing system 450 comprises a source of coating material 451, a dispensing nozzle 452, and a conduit 453 extending from the source of coating material 451 to the dispensing nozzle 452. The dispensing system 450 is configured to dispense an amount of the coating material 460 onto the front surface 203 of the substrate 200. In some embodiments, the dispensing system 450 may be omitted. In such embodiments, a machine operator or other user may manually place the coating material 460 onto the front surface 203 of the substrate 200. Thus, the dispensing of the coating material 460 onto the substrate 200 may be achieved automatically or manually and may take on any form and structure as is well known in the art of spin coating.

As noted above, the coating material 460 may be dispensed onto the front surface 203 of the substrate 200 before the substrate 200 is made to rotate or after the substrate 200 is made to rotate at a low rotational velocity. This may depend on the viscosity of the coating material 460, the desired thickness of the film of the coating material 460, and other factors specific to the particular process being undertaken. Unless specifically stated otherwise, the coating material 460 may be dispensed onto the front surface 203 of the substrate 200 either before the substrate 200 has begun to rotate or after the substrate 200 has begun to rotate. Either way, the bolus or other amount of the coating material 460 is dispensed onto the substrate 200 near the center-point CP of the substrate 200 as shown in FIG. 4B.

The next step in the process is to begin rotating the substrate 200 about the rotational axis R-R. Of course, as noted above the substrate 200 may already be rotating before the coating material 460 is dispensed thereon. In such embodiments, the rotational velocity of the substrate 200 may be increased once the coating material 460 is dispensed. The substrate 200 is coupled to the chuck 130 via vacuum suction or any other techniques used in the art. Thus, to rotate the substrate 200 the motor 115 is activated, which causes the chuck 130 to rotate, which in turn causes the substrate 200 to rotate. As the substrate 200 rotates, the coating material 460 spreads out over the front surface 203 of the substrate 200 due to the centrifugal force. The rotational velocity of the substrate 200 in conjunction with the size/diameter of the substrate 200 and the viscosity of the coating material 460 may dictate the thickness of the film of the coating material 460 that is ultimately formed on the substrate 200.

As mentioned above, when the substrates 200 are polygonal shaped, there can be difficulty in obtaining a uniform thickness along the front surface 203 of the substrate 200 due to decreased pressure and increased turbulence at the corner portions 205 of the front surface 203 of the substrate 200. Specifically, these factors tend to result in the film of the coating material 260 being thicker along the corner portions 205 then elsewhere along the front surface 203 of the substrate 200. In order to address this, the current invention injects a gas onto the corner portion 205 of the front surface 203 of the substrate 200 during the spin coating process.

Figure 5A:
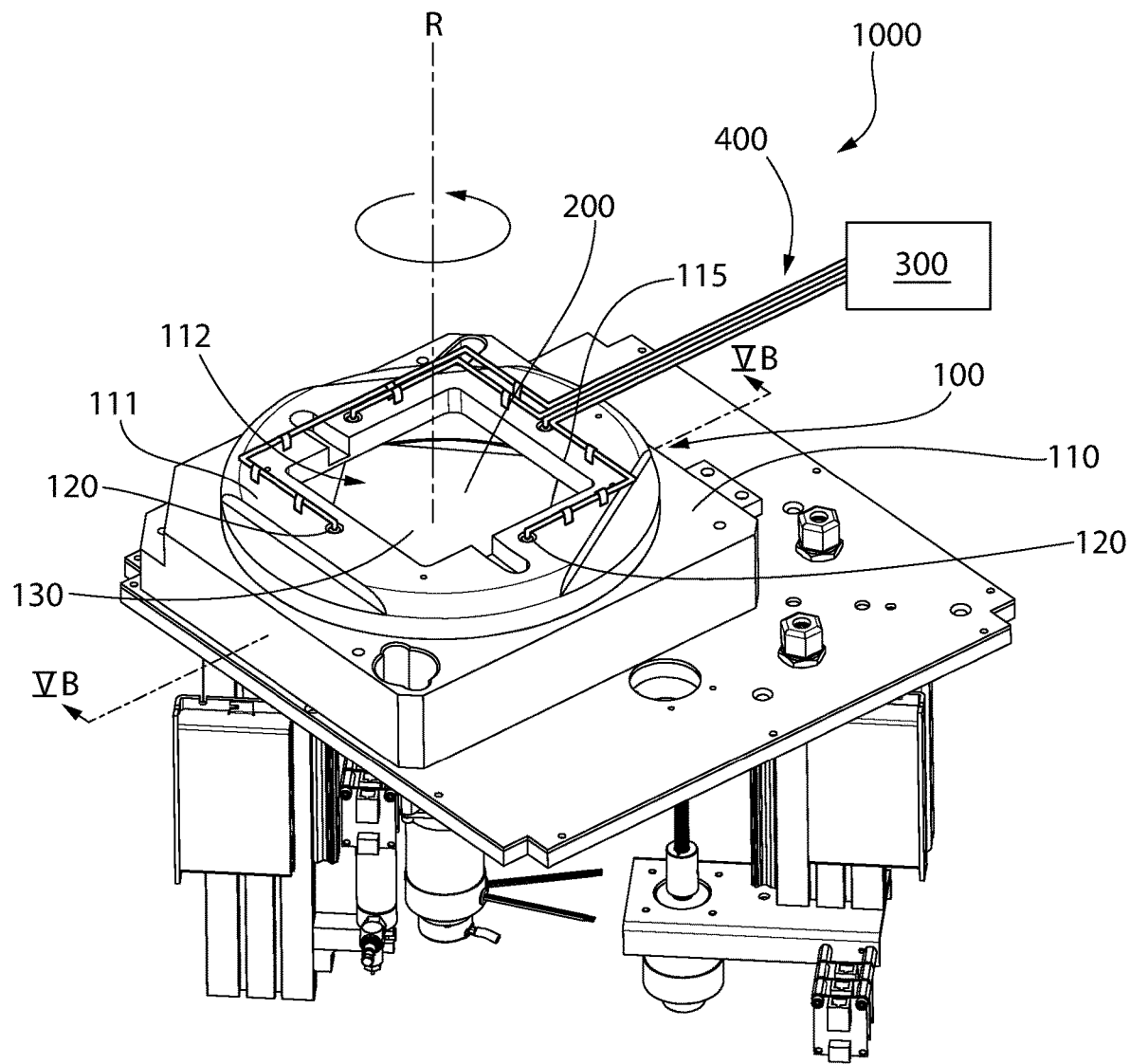
FIG. 5A is a perspective view of the spin coating system of FIG. 1 with the substrate having been rotated relative to its insertion position so that corners of the substrate are aligned with gas injection ports.
Figure 5B:
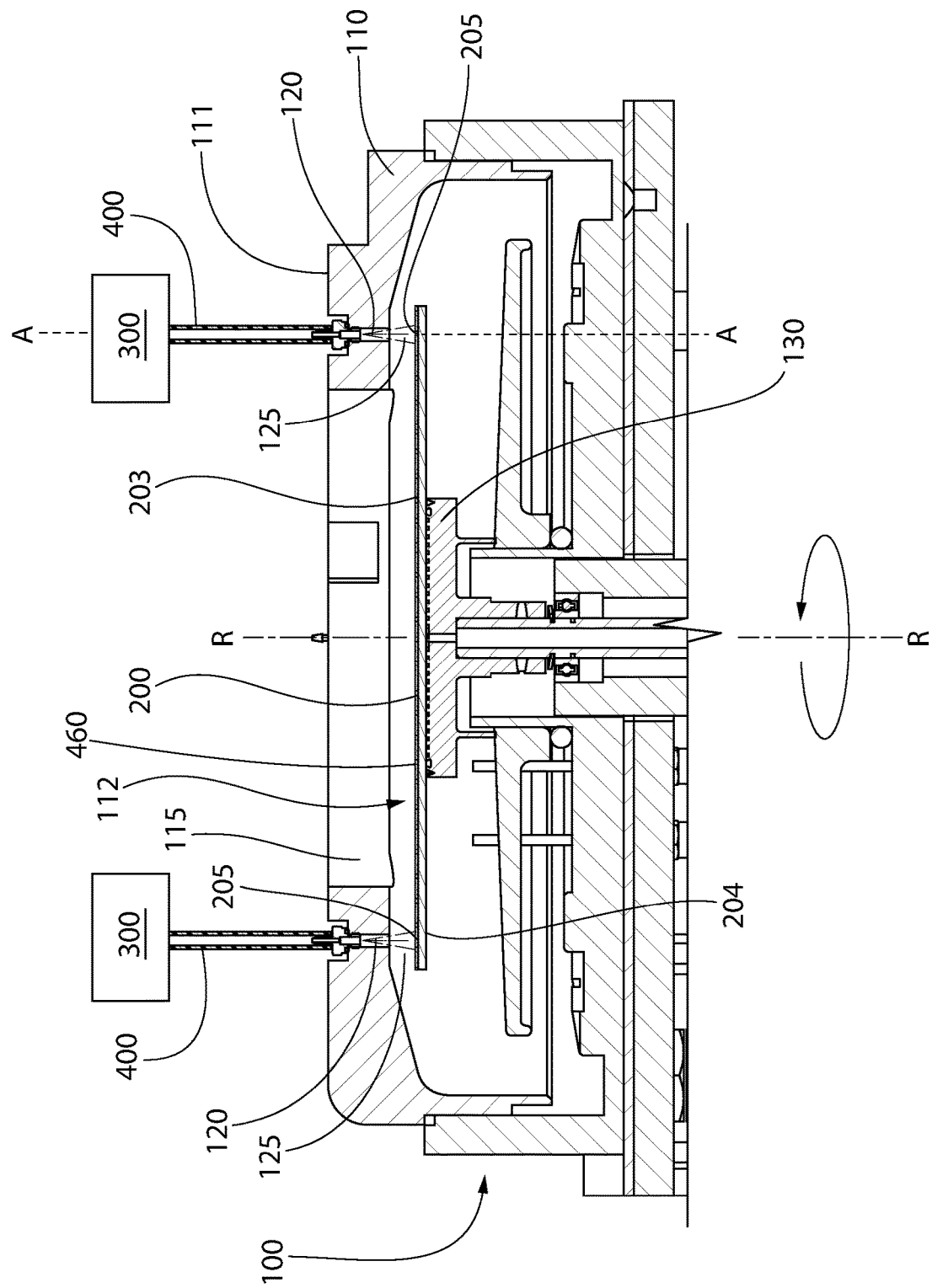
FIG. 5B is a cross-sectional view taken along line VB-VB of FIG. 5A.

Referring to FIGS. 5A and 5B, the spin coating system 1000 is illustrated with the substrate 200 having been rotated approximately 45° (or 135°, or 225°, or 315°) relative to its orientation when first loaded into the process chamber 112. As a result, the corner portions 205 of the front surface 203 of the substrate 200 are no longer aligned with the opening 115 in the housing 110, but rather each of the corner portions 205 of the front surface 203 of the substrate 200 is aligned with one of the gas injection ports 120.

Furthermore, as best shown in FIG. 5B, during the spin coating process, while the substrate 200 is rotating about the rotational axis R-R, gas 125 is injected from the source of gas 300 into the process chamber 112 via the gas injection ports 120. The gas 125 is ejected from the gas injection ports 120 in a fluid stream having a primary flow axis A-A that is perpendicular to the front surface 203 of the substrate 200 and parallel to the rotational axis R-R of the substrate 200.

Due to the specific location of the gas injection ports 120 as described herein and shown in the drawings, the gas 125 that flows through the gas injection ports 120 (i.e., the fluid stream) contacts the front surface 203 of the substrate at the corner portions 205 as the substrate 200 rotates about the rotational axis R-R. This increases the pressure along the corners of the substrate 200 and prevents an excessive build-up of the coating material 460 along the corners of the substrate 200. Thus, the introduction of the gas 125 as described herein increases the uniformity of the film of the coating material. The gas may be introduced into the process chamber 112 as a gas stream having a velocity in a range of 2-5 ft³/hour (approximately 0.9 liters/minute to 2.5 liters/minute), although flow rates outside of this range are also possible and would fall within the scope of the invention described herein in some embodiments.

The substrate 200 continues to rotate until the desired thickness of the coating material 460 has been achieved. Specifically, as the substrate 200 rotates, the coating material 460 spreads into a uniform resist film of a desired film thickness. Some of the coating material 460 may flow beyond the edges of the substrate 200 depending on how much of the coating material 460 is initially dispensed and the desired thickness of the coating material 460.

Figure 6:
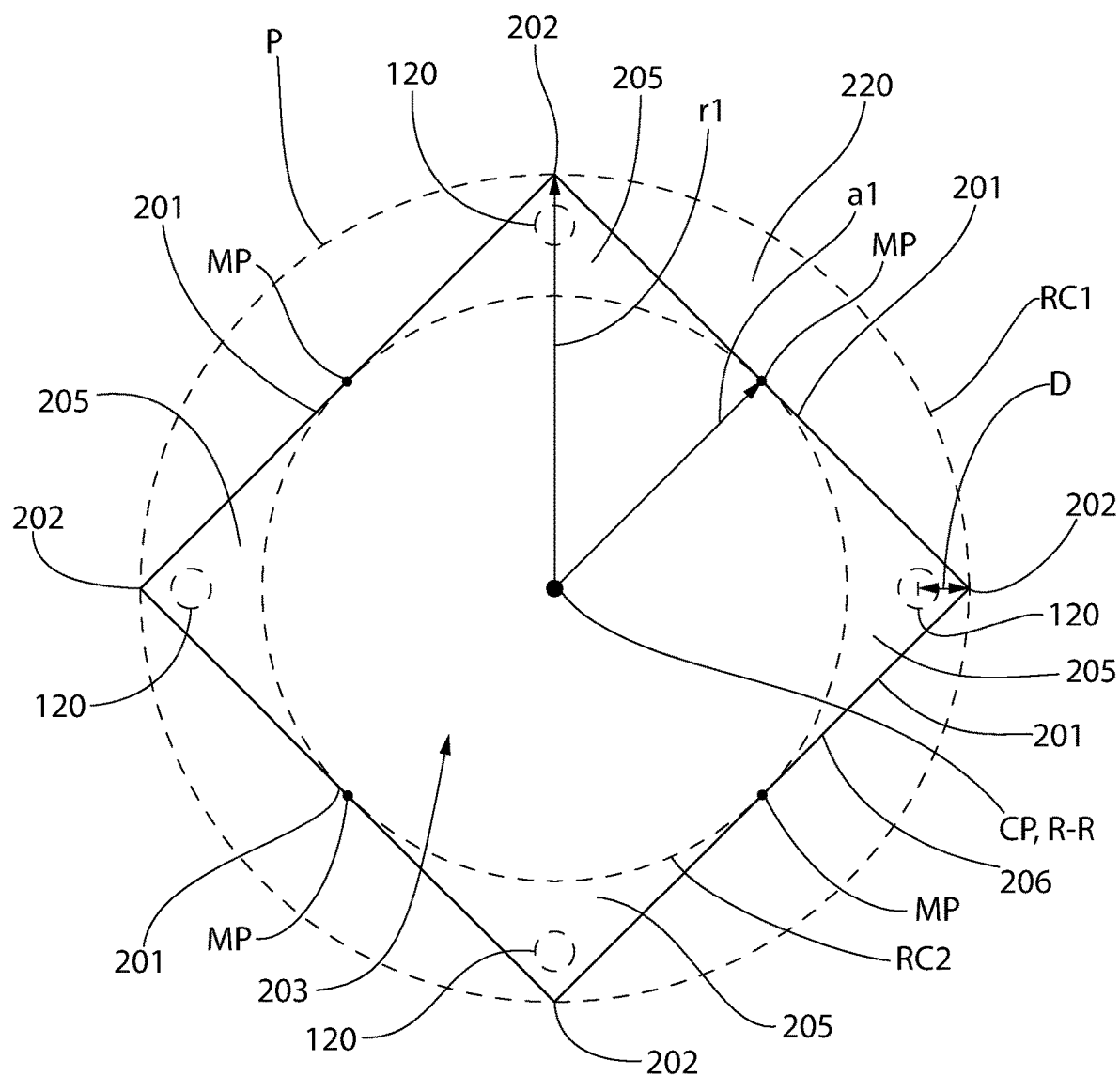
FIG. 6 is a schematic view of a square substrate illustrating inner and outer reference circles associated with a rotational path of various points on the substrate and also illustrating the location of gas injection ports.

FIG. 6 is a schematic illustration showing the substrate 200 from an overhead or top view and also shows the positions of the gas injection ports 120 relative to the substrate 200. The substrate 200 has a center-point CP and the rotational axis R-R upon which the substrate 200 rotates intersects the center-point CP. In the exemplified embodiment, the substrate 200 is square and has four sides 202 and four vertices 202. As the substrate rotates 200 about the rotational axis R-R for a full 360° rotation/revolution, each vertex 202 rotates about a path that defines an outer reference circle RC1, illustrated in FIG. 6 in dashed lines. Stated another way, the substrate 200 has a radius r1 which is measured from the center-point CP of the substrate 200 to any one of its vertices 202. The outer reference circle RC1 is coplanar with the front surface 203 of the substrate 200, shares the same center-point CP as the substrate, and has a radius that is equal to the radius r1 of the substrate 200. The substrate 200 is inscribed in the outer reference circle RC1 such that every vertex 202 of the substrate 200 is located on or in contact with the outer reference circle RC1.

Moreover, each of the sides 201 of the substrate 200 has a midpoint MP. The substrate 200 has an apothem al measured from the center-point CP of the substrate 200 to the midpoint MP of any of the sides 201. As the substrate 200 rotates about the rotational axis R-R for a full 360° revolution/rotation, each of the midpoints MP rotates about a path that defines an inner reference circle RC2, illustrated in FIG. 6 in dashed lines. The inner reference circle RC2 is coplanar with the front surface 203 of the substrate 200, has the same center-point C as the substrate 200, and has a radius that is equal to the apothem of the substrate 200. The corner portions 205 of the front surface 203 of the substrate 200 are located between the inner reference circle RC2 and a peripheral edge 206 of the substrate 200, the peripheral edge 206 being the edge that is located between the front and rear surfaces 203, 204 of the substrate 200. The inner reference circle RC2 is inscribed in the substrate 200. Thus, every side 201 of the substrate 200 is tangent to the inner reference circle RC2.

There is a reference ring 220 defined between the inner and outer reference circles RC1, RC2. Thus, the reference ring 220 is the region bounded on the exterior by the outer reference circle RC2 and on the interior by the inner reference circle RC1. The corner portions 205 of the front surface 203 of the substrate 200 are those portions of the substrate 200 that are located within the reference ring 220 as the substrate 200 rotates about the rotational axis R-R. Thus, in FIG. 6, the portions of the front surface 203 of the substrate 200 that are illustrated located within the reference ring 220 form the corner portions 205 described herein.

As can be seen, the gas injection ports 120 are positioned so that they are periodically aligned with corner portions 205 of the front surface 203 of the substrate 200 as the substrate 200 rotates. Specifically, the location of the gas injection ports 120 is fixed, but the substrate 200 is rotating during a spin coating process. Thus, the corner portions 205 of the front surface 203 of the substrate 200 come into and out of alignment with the gas injection ports 120 as the substrate 200 rotates.

The gas injection ports 120 are located so as to be aligned with the reference ring 220. The gas ejected from the gas injection ports 120 is ejected along the reference ring 220. In the exemplified embodiment, the outer reference circle RC1 has a perimeter P and the radius r1. Furthermore, the gas injection ports 120 are located at a distance D from the perimeter P of the outer reference circle RC1. In some embodiments, the distance D is no greater than one-third of the radius r1. In other embodiments, the distance D may be no greater than one-fourth of the radius r1, and in still other embodiments the distance D may be no greater than one-fifth of the radius r1, or one-sixth of the radius r1, or one-seventh of the radius r1, or one-eighth of the radius t1, or one-ninth of the radius r1, or one-tenth of the radius r1. Thus, the gas that flows into the process chamber 112 from the gas injection ports 120 flows along the reference ring 220 between the inner and outer reference circles RC1, RC2. In the exemplified embodiment, all of the gas injection ports 120 are aligned with the reference ring 220, which ensures that the gas being introduced into the process chamber 112 contacts the substrate 200 only along portions thereof that are adjacent to its corners (i.e., the corner portions 205).

As noted above, instead of discrete, spaced apart gas injection ports 120, the spin coating system 1000 could include a single gas port that extends in a 360° circle. Furthermore, although four spaced apart gas injection ports 120 are illustrated, additional gas injection ports 120 could be included that would introduce the gas into the process chamber 112 along the reference ring 220 as described herein. It might also be possible to achieve the desired results with a single, discrete gas injection port 120 in one of the positions illustrated in the drawings provided herewith. This is because each corner portion 205 of the front surface 203 of the substrate 200 will pass by the single gas injection port 120 as the substrate 200 rotates, so having four discrete gas injection ports 120 may not be necessary in all embodiments.

Referring to FIGS. 7A-7D, the spin coating process is schematically illustrated. FIGS. 7A-7D illustrate the substrate 200 rotating about the rotational axis R-R. Also illustrated in FIGS. 7A-7D are the inner and outer reference circles RC1, RC2, the reference ring 220, and the gas injection ports 120 that are aligned with the reference ring 220. In each of FIGS. 7A-7D, the substrate 200 is illustrated multiple times to show its orientation and position relative to the inner and outer reference circles RC1, RC2 and relative to the gas injection ports 120 as the substrate 200 rotates about the rotational axis R-R. Thus, as can be seen, at certain points in time during its rotation, none of the gas injection ports 120 are aligned with the substrate 200 and in other points in time during its rotation, each of the gas injection ports 120 is aligned with one of the corner portions 205 of the substrate 200. Of course, alternative embodiments are possible where the gas injection ports 120 are located so that all of the gas injection ports 120 are never simultaneously aligned with the substrate 200. For example, different ones of the gas injection ports 120 could be aligned with one of the corner portions 205 of the substrate 200 at different rotational orientations of the substrate 200.

FIG. 7A illustrates the process schematically with the substrate 200 rotating. In FIG. 7B, an amount of the coating material 460 has been dispensed onto the front surface 203 of the substrate 200. As mentioned above, the coating material 460 may be placed onto the front surface 203 of the substrate 200 before the substrate 200 is rotating in other embodiments.

As the substrate 200 rotates with the coating material 460 thereon, the coating material 460 begins to spread along the front surface 203 of the substrate 200 as shown sequentially in FIGS. 7B-7D. As shown in FIG. 7D, eventually the coating material 460 forms a film that covers the entirety of the front surface 203 of the substrate 200. During this process, the gas is injected onto the front surface 203 of the substrate 200 via the gas injection ports 120 along the corner portions 205 of the front surface 203 of the substrate 200 to prevent excessive build-up of the coating material 460 on the corner portions 205. Thus, when the substrate 200 stops rotating, a uniform thickness film of the coating material 460 remains on the front surface 203 of the substrate 200.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A method of spin coating a substrate having a polygonal shape, the method comprising:
    performing a spin coating operation comprising:
        loading the substrate into a process chamber of a spin coating apparatus through an opening having a polygonal shape that corresponds with the polygonal shape of the substrate;
        dispensing a coating material onto a front surface of the substrate;
        rotating the substrate about a rotational axis to form a film of the coating material that substantially covers the front surface of the substrate; and
        injecting a gas onto corner portions of the front surface of the substrate while the substrate remains located within the process chamber of the spin coating apparatus and is rotating about the rotational axis; and
    wherein the spin coating apparatus comprises a housing having a roof portion, the opening formed into the roof portion and having a maximum width, and further comprising a plurality of gas injection ports extending through the roof portion adjacent to the opening, each of the gas injection ports forming a passageway into the process chamber, and wherein the substrate comprises a diagonal that is larger than the maximum width of the opening so that during rotation of the substrate about the rotational axis the corner portions of the front surface of the substrate become aligned with the gas injection ports as the corner portions of the front surface of the substrate extend under the roof portion so that the gas injected through the gas injection ports contacts the corner portions of the front surface of the substrate.

2. The method according to claim 1 further comprising an inner reference circle that is coplanar with the front surface of the substrate, the inner reference circle having a centerpoint that is intersected by the rotational axis and a radius that is equal to an apothem of the substrate, and wherein the corner portions of the front surface of the substrate are located between the inner reference circle and a peripheral edge of the substrate.

3. The method according to claim 1 wherein the substrate comprises a plurality of vertices and a plurality of sides, each of the sides extending between two of the vertices and having a midpoint, wherein upon completion of a 360° rotation of the substrate about the rotational axis, a path of the midpoint of each side of the substrate defines an inner reference circle and a path of each of the vertices defines an outer reference circle, and wherein the gas is injected onto the front surface of the substrate along a reference ring that is located between the inner and outer reference circles.

4. The method according to claim 3 wherein the outer reference circle has a radius that is equal to a radius of the substrate and the inner reference circle has a radius that is equal to an apothem of the substrate, and wherein a center-point of the inner and outer reference circles is intersected by the rotational axis of the substrate.

5. The method according to claim 1 wherein the gas is ejected from a nozzle towards the front surface of the substrate in a gas stream having a primary axis that is parallel to the rotational axis of the substrate and perpendicular to the front surface of the substrate.

6. The method according to claim 1 further comprising an outer reference circle that is coplanar with the front surface of the substrate, the outer reference circle having a center-point that is intersected by the rotational axis and a radius that is equal to a radius of the substrate, and wherein the gas is injected onto the front surface of the substrate at an injection location that is located at a distance from a perimeter of the outer reference circle that is no greater than one-fourth of the radius of the outer reference circle.

7. The method according to claim 1 wherein the opening is defined by a plurality of sides and a plurality of vertices, and wherein each of the gas injection ports is located along one of the sides of the opening at a position that is equidistant to two of the vertices that the one of the sides extends between.

8. The method according to claim 1 wherein each of the gas injection ports is at a fixed location such that each corner portion of the front surface of the substrate passes by each of the gas injection ports one time during each revolution of the substrate.

9. The method according to claim 1 wherein an entirety of the gas injection ports are aligned with the corner portions of the front surface of the substrate and positioned radially inward of a peripheral edge of the substrate as the corner portions of the front surface of the substrate rotate into alignment with the gas injection ports.

10. The method according to claim 1 wherein the gas that is injected onto the corner portions of the front surface of the substrate consists of a non-reactive gas.

11. The method according to claim 1 wherein the gas is injected onto the corner portions of the front surface of the substrate at a velocity of 2-5 ft$^3$/hour.

12. A method of coating a substrate comprising:
performing a spin coating operation comprising:
loading the substrate into a process chamber of a spin coating apparatus through an opening in a roof portion of the spin coating apparatus, the opening and the substrate having a same polygonal shape comprising a plurality of vertices and a plurality of sides;

dispensing a coating material through the opening and onto a front surface of the substrate;

rotating the substrate about a rotational axis, wherein upon a 360° rotation of the substrate a path of each of the plurality of vertices of the substrate defines an outer reference circle and a path of a midpoint of each of the plurality of sides of the substrate defines an inner reference circle, a reference ring being defined between the inner and outer reference circles; and injecting a gas onto corner portions of the front surface of the substrate that are located along the reference ring as the corner portions of the front surface of the substrate pass under the roof during rotation of the substrate about the rotational axis.

13. The method according to claim 12 wherein the inner and outer reference circles have the same center-point, and wherein the center-point of the inner and outer reference circles is intersected by the rotational axis of the substrate.

14. The method according to claim 12 wherein the outer reference circle has a radius that is equal to a radius of the substrate and the inner reference circle has a radius that is equal to an apothem of the substrate.

15. The method according to claim 12 wherein the substrate and the opening are square or rectangular shaped.

16. A method of coating a substrate comprising:
loading the substrate into a process chamber of a spin coating apparatus through an opening in a roof of the spin coating apparatus, the opening having a first polygonal shape and the substrate having a second polygonal shape that corresponds to the first polygonal shape of the opening;

dispensing a coating material through the opening and onto a front surface of the substrate;

rotating the substrate about a rotational axis to form a film of the coating material that substantially covers the front surface of the substrate; and while rotating the substrate about the rotational axis to form the film of the coating material, injecting a gas onto the corner portions of the front surface of the substrate as the corner portions of the front surface of the substrate pass under the roof of the spin coating apparatus.

* * * * *